United States Patent [19] [11] 4,146,905
Appels et al. [45] Mar. 27, 1979

[54] SEMICONDUCTOR DEVICE HAVING COMPLEMENTARY TRANSISTOR STRUCTURES AND METHOD OF MANUFACTURING SAME

[75] Inventors: Johannes A. Appels; Franciscus C. Eversteijn, both of Eindhoven, Netherlands

[73] Assignee: U.S. Philips Corporation, New York, N.Y.

[21] Appl. No.: 876,908

[22] Filed: Feb. 13, 1978

Related U.S. Application Data

[63] Continuation of Ser. No. 585,957, Jun. 11, 1975, abandoned.

[30] Foreign Application Priority Data

Jun. 18, 1974 [NL] Netherlands ......................... 7408110

[51] Int. Cl.² .................... H01L 27/02; H01L 27/12; H01L 27/04; H01L 29/72
[52] U.S. Cl. ...................................... 357/44; 357/34; 357/48; 357/49; 357/59; 357/89
[58] Field of Search ...................... 357/34, 44, 48, 49, 357/50, 59, 89

[56] References Cited

U.S. PATENT DOCUMENTS

| 3,423,255 | 1/1969 | Joyce | 357/49 |
|---|---|---|---|
| 3,507,713 | 4/1970 | Kravitz | 357/49 |
| 3,591,430 | 7/1971 | Schlegel | 357/89 |
| 3,722,079 | 3/1973 | Beasom | 357/49 |
| 3,752,715 | 8/1973 | Antipov et al. | 357/44 |
| 3,764,409 | 10/1973 | Nomura et al. | 357/48 |
| 3,797,102 | 3/1974 | Huffman | 357/49 |
| 3,858,237 | 12/1974 | Sawazaki et al. | 357/49 |
| 3,912,555 | 10/1975 | Tsuyuki | 357/44 |
| 3,938,176 | 2/1976 | Sloan | 357/49 |
| 3,954,522 | 5/1976 | Roberson | 357/44 |
| 4,007,474 | 2/1977 | Yagi et al. | 357/89 |
| 4,027,324 | 5/1977 | Yagi et al. | 357/89 |
| 4,032,957 | 6/1977 | Yagi et al. | 357/89 |

OTHER PUBLICATIONS

Chang et al., "Fabrication of PNP and NPN Transistors In a Single Wafer or Chip," IBM Tech. Disclosure Bulletin, vol. 11, (5/69), pp. 1653-1654.
Jacobus et al., "Complementary Transistors," IBM Technical Disclosure Bulletin, vol. 14, (9/71), p. 1045.

Primary Examiner—William D. Larkins
Assistant Examiner—Gene M. Munson
Attorney, Agent, or Firm—Thomas A. Briody; Steven R. Biren

[57] ABSTRACT

A semiconductor device includes a body comprising two planar complementary transistor structures preferably but not exclusively with dielectric insulation. Both complementary transistor structures comprise parts of two epitaxial layers of opposite conductivity types present one on top of the other, the first layer forming the base zone of the first transistor and the second layer forming the collector zone of the second transistor, the emitter zone of the first transistor and the base zone of the second transistor being formed by parts of the second layer.

3 Claims, 18 Drawing Figures

SEMICONDUCTOR DEVICE HAVING COMPLEMENTARY TRANSISTOR STRUCTURES AND METHOD OF MANUFACTURING SAME

This is a continuation of application Ser. No. 585,957, filed June 11, 1975, now abandoned.

The invention relates to a semiconductor device having a body comprising at least a first epitaxial semiconductor layer of a first conductivity type and a second epitaxial semiconductor layer of the second opposite conductivity type which is present thereon and which adjoins a surface of the body, and comprising at least two complementary bipolar transistor structures insulated electrically from each other, the base zone of the first transistor structure being formed by at least a part of the first epitaxial layer and the base zone of the second transistor structure being formed by at least a part of the second epitaxial layer.

The invention further relates to a method of manufacturing the semiconductor device.

Complementary transistor structures are to be understood to mean commonly two transistor structures the corresponding zones of which have opposite conductivity types (npn and pnp).

Semiconductor devices of the kind described are known, for example, from French Patent Specification No. 1,448,776.

It has already been tried in many manners to manufacture integrated circuits having complementary transistor structures by using two or more epitaxial layers. Said transistor structures may be used either individually as a transistor, or may form part of a more complicated semiconductor circuit element, for example, a pnpn thyristor.

However, it has so far proved to be very difficult to provide complementary transistor structures in such a circuit in such manner that both transistor structures show a large amplification factor and show comparable and good electrical properties also in other respects, notably as regards the frequency range. For example, in many cases it has not been possible to construct both complementary transistor structures with an epitaxial base (as a result of which they are suitable in particular for use at comparatively low frequency). In other cases, such as described in the above-mentioned French Patent Specification, in which two complementary transistor structures with epitaxial base are realized indeed, one has to resort to mesa structures. This is disadvantageous since in general, in particular with a view to the metallization, integrated circuits having a flat or substantially flat surface are preferred.

One of the objects of the invention is to provide a semiconductor device having a new structure in which the above-described drawbacks occurring in known devices are avoided or are reduced at least to a considerable extent. Another object of the invention is to provide a semiconductor device which enables in a simple manner the realization of an integrated circuit having at least two complementary low frequency transistors and which is very suitable for use in integrated circuits with dielectric insulation.

The invention is based inter alia on the recognition that by using the said epitaxial layers efficaciously for the formation of both the base zone and the emitter zone of the same transistor, a transistor structure can be obtained which is not only very suitable for combination with a complementary transistor structure with epitaxial base, but in addition shows electric properties which are at least equally good as those of known transistor structures.

For that purpose, a semiconductor device of the kind described in the preamble is characterized according to the invention in that both transistor structures are provided in islands which adjoin the same substantially flat surface of the body and are separated from the remaining part of the body by a barrier layer, that the collector zone of the second transistor structure is formed by at least a part of the first epitaxial layer, and that the first transistor structure comprises a surface-adjoining semiconductor region of the second conductivity type which substantially entirely surrounds a surface-adjoining region formed by parts of the first and second epitaxial layer within the body and forms the collector zone, at least a connection zone of the first conductivity type which extends from the surface down to the first epitaxial layer being present, said connection zone being separated from the said semiconductor region of the second conductivity type, being more highly doped than the first epitaxial layer and entirely surrounding a part of the second epitaxial layer which forms the emitter zone.

The semiconductor device according to the invention has two complementary transistor structures, both with epitaxial base and therefore being suitable for low frequency operation.

One of the advantages of the said first transistor structure the emitter zone of which is formed by a part of the second epitaxial layer is, that the injection of minority charge carriers from the emitter zone takes place substantially entirely in a direction transverse to the surface and substantially not at all in a lateral direction. This is caused by the fact that the connection zone of the first conductivity type which surrounds the emitter zone is more highly doped in the proximity of the surface and in general is considerably more highly doped than the active part of the base zone present between the emitter zone and the collector zone. A further advantage of the said first transistor structure is that, with the exception of the area of the connection zone, the base zone nowhere emerges at the surface. As a result of this the influence of the surface recombination is small. As a result of the said circumstances, the electric properties of the first transistor structure may be at least equally good as those of conventional transistor structures comprising or not comprising an epitaxial base zone.

By using the invention, a semiconductor device having complementary transistor structures is in addition obtained with a flat or substantially flat surface, since both the first and the second epitaxial layer form part of both transistor structures so that mesa structures can be avoided.

Although, as will become apparent from an embodiment to be described hereinafter, the said connection zone of the first conductivity type can also be separated from the region of the second conductivity type in a different manner, for example, by an insulating layer, the connection zone is preferably separated from said region by a part of the second epitaxial layer.

The said barrier layer may be formed, for example, by a pn junction which is reversely biased in the operating condition. However, according to an important preferred embodiment the barrier layer is formed by an insulating layer of dielectric material. The complementary transistor structures are thus electrically insulated in all circumstances, it not being necessary in the operating condition to apply voltages to obtain said insulation.

In order to reduce the collector resistance of the first transistor structure while maintaining a comparatively high base-collector breakdown voltage, the said region of the second conductivity type is preferably more highly doped, at least in its part adjoining the second epitaxial layer, than the adjoining part of the second epitaxial layer. Moreover, in order to improve the emitter efficiency, advantageously the said emitter zone at least partly, and preferably entirely is more highly doped than the surrounding part of the second epitaxial layer.

In all the above-mentioned cases, the semiconductor device is preferably also formed so that the second transistor structure which is complementary to the first one comprises a surface-adjoining region of the first conductivity type which surrounds a surface-adjoining region formed by parts of the first and second epitaxial layer within the body substantially entirely. As a result of this, the collector zone of the second complementary transistor structure can be contacted at the surface in a simple manner, whereas the collector series resistance is reduced.

A semiconductor device according to the invention in which the body consists entirely of monocrystalline semiconductor material is further preferably characterized in that the said region of the first conductivity type and the said region of the second conductivity type both comprise a buried layer which is connected to the surface, via a zone of the same conductivity type, and forms a surface-terminating pn junction with the surrounding part of the semiconductor body. As a result of this, the complementary transistor structures are each in themselves insulated from the remaining part of the body.

A structure having three epitaxial layers is often advantageously used, the first epitaxial layer being present on a third epitaxial layer which is provided on a substrate and forms a p-n junction therewith. Although such a preferred embodiment can also be used in dielectrically insulated complementary transistor structures, it is often of particular advantage in the realization of transistor structures which are insulated by p-n junctions and in which the presence of the third epitaxial layer increases the tolerances upon providing in particular the necessary buried layers.

The invention furthermore relates to a particularly advantageous method of manufacturing a semiconductor device according to the invention with dielectrically insulated transistor structures. This method is characterized in that a first epitaxial layer of a first conductivity type and a second epitaxial layer of a second conductivity type present thereon are provided on a support, that at least two islands which are covered with an insulating dielectric layer are formed from the epitaxial layers, that a transistor structure is provided in one island and a transistor structure complementary thereto is provided in the other island, and that, prior to providing the dielectric layer, an island is provided with a surface layer of the first conductivity type and the other island is provided with a surface layer of the second conductivity type by the introduction of doping materials.

The invention will now be described in greater detail with reference to a few examples and the drawing, in which.

The Figures are diagrammatic and not drawn to scale, the dimensions, in particular in the direction of thickness, being exaggerated for clarity. In the semiconductor regions shown in cross-section, regions of the same conductivity type are shaded in the same direction. Furthermore, the boundaries of the various zones, in particular of the zones provided by doping, for example, by diffusion, are not in accordance with reality but are purely diagrammatic. In the drawings, notably the extension of the various zones occurring parallel to the surface by lateral diffusion is neglected entirely for clarity.

Except for the boundaries between epitaxial layers mutually and those between an epitaxial layer and the substrate, which are always shown as solid lines, boundaries between regions of the same conductivity type but different doping are generally shown in broken lines, and p-n junctions by solid lines.

Figure 1:
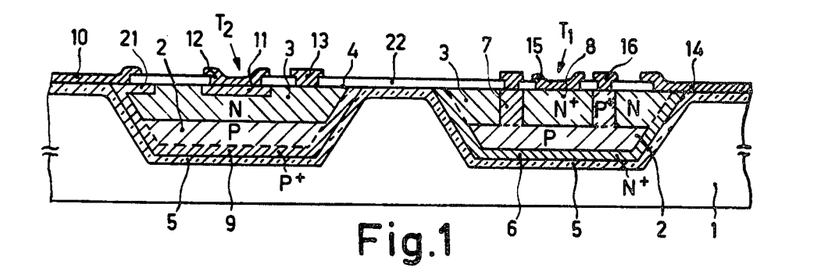
FIG. 1 is a diagrammatic cross-sectional view of a semiconductor device according to the invention.

FIG. 1 is a diagrammatic cross-sectional view of a semiconductor device according to the invention. The device comprises a body consisting of a support 1 of polycrystalline silicon, a first epitaxial silicon layer 2 which in this Example is chosen to be p-type conductive, and a second n-type conductive epitaxial silicon layer 3 present thereon. Although the above-mentioned conductivity types have been chosen in this Example for the layers 2 and 3, said conductivity types may also be reversed provided they are opposite to each other. The second n-type conductive epitaxial layer 3 adjoins a surface 4 of the body.

The device comprises two complementary bipolar transistor structures which are electrically insulated from each other, a first npn transistor structure $T_1$ the base zone of which is formed by the first epitaxial layer 2 and a second (pnp) transistor structure $T_2$ which is complementary to the transistor structure $T_1$ and the base zone of which is formed by the second epitaxial layer 3. According to the invention the two complementary transistor structures $T_1$ and $T_2$ are provided in islands which adjoin the same flat surface (4) of the body and are separated from the remaining part of the body by a barrier layer, in this Example an electrically insulating silicon oxide layer 5, the collector zone of the second transistor structure $T_2$ being formed by the first epitaxial layer 2. According to the invention, the first transistor structure $T_1$ further comprises a layer-shaped highly doped n-type conductive region 6 which adjoins the surface 4 and which surrounds a region formed by parts of the epitaxial layers 2 and 3 adjoining the surface 4 within the body substantially entirely and which forms the collector zone of the first transistor structure. A p-type conductive connection zone 7 is present which is separated from the region 6 by a part of the second epitaxial layer 3, extends from the surface 4 down to the first epitaxial layer 2, is more highly doped than the first epitaxial layer 2 and surrounds entirely a part 8 of the second epitaxial layer 3, which part 8 forms the emitter zone.

The collector zone of the second complementary transistor structure $T_2$ is contacted by means of a highly doped p-type conductive layer 9 which, within the island in which $T_2$ is provided, surrounds the epitaxial layers 2 and 3 subsdtantially entirely and extends up to the surface 4 where it can be contacted by a metal layer 10. The emitter of the transistor structure $T_2$ is a p-type zone 11 which is provided in the layer 3, for example, by diffusion or by ion implantation and which is contacted by a metal layer 12. The base zone of the transistor structure $T_2$ is contacted by a metal layer 13, if necessary via a contact diffusion, while of the transistor structure $T_1$ the collector zone 6 and the emitter zone 8 are contacted by metal layers 14 and 15 and the base zone 2 is contacted by a metal layer 16 via the connection zone 7.

The semiconductor device described has a substantially flat surface and comprises two complementary transistors $T_1$ and $T_2$ which both have an epitaxial base and are suitable as such for use at comparatively low frequencies. In the embodiment described both transistor structures are constructed as single transistors. It will be obvious, however, that one or both transistors may also be constructed, for example, as a thyristor, for example, by providing in the n-type zone 8 another extra p-type zone which is surrounded entirely by the zone 8 and providing contacts on said p-type zone and on the zone 6 as well as a control electrode on one of the zones 7 or 8. The thyristor obtained in this manner also comprises a transistor structure $T_1$ which is complementary to the transistor structure $T_2$.

Figure 2:
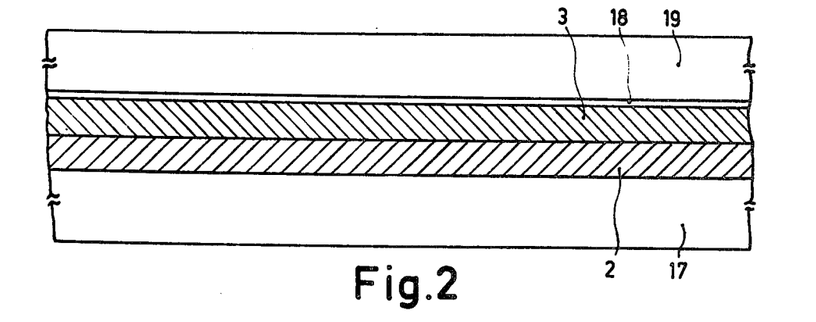
FIGS. 2 to 5 are diagrammatic cross-sectional views of successive stages of manufacturing the device shown in FIG. 1 while using the method according to the invention.

The device described according to the invention can advantageously be manufactured as follows. Starting material (see FIG. 2) is a highly doped monocrystalline n-type silicon substrate 17 having a resistivity of, for example, 0.001 Ohm.cm and a thickness of, for example, 250 microns. On said substrate are grown epitaxially by means of methods conventionally used in semiconductor technology, for example, by thermal decomposition of $SiH_4$, successively a first p-type silicon layer 2 having a thickness of approximately 15 microns and a resistivity of, for example, 4 Ohm.cm and a second n-type silicon layer 3 having a thickness of approximately 10 microns and a resistivity of, for example, 1.5 Ohm.cm. A layer 18 of silicon nitride having a thickness of approximately 0.15 microns is then deposited in the usual manner across the layer 3 (if desired after providing a thin oxide layer of approximately 0.1 micron which is not shown), after which an approximately 150 microns thick layer 19 of polycrystalline silicon is deposited on the nitride layer 18 from the gaseous phase. The structure shown in FIG. 2 is then obtained. The layers 18 and 19 together constitute an auxiliary supporting layer.

The highly doped substrate 17 is then removed, for example, by using a selective chemical or electrochemical etching method having a specific high etching rate for highly doped n-type silicon, after which island-shaped regions I and II (see FIG. 3) are formed from the epitaxial layers 2 and 3 by masking and etching. The silicon nitride layer 18 protects the polycrystalline silicon layer 19 during said etching treatment.

Figure 3:
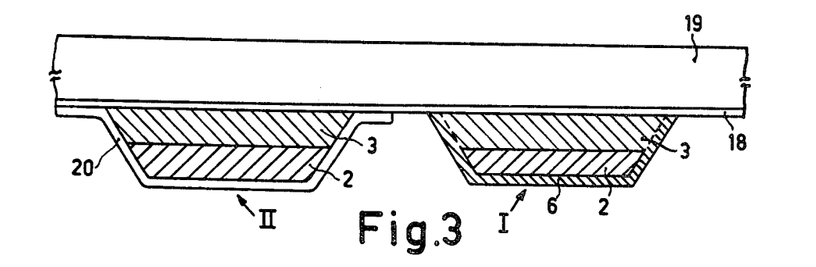

The island II is then provided with a masking 20. This is carried out, for example, by pyrolytically depositing a layer of silicon oxide (silox) on the assembly and partly etching away said layer so that the island I is uncovered. The island I is then provided with a highly doped n-type surface layer 6, for example, by indiffusion of arsenic. The situation shown in FIG. 3 is then obtained.

The island I is then masked in the same manner and the island II is provided with a p-type surface layer 9 by a boron diffusion, after which a layer 5 of pyrolytic silicon oxide having a thickness of 1 to 2 microns is deposited on the assembly. If desired, said oxide layer 5 may also be provided by thermal oxidation and, of course, then is absent between the islands I and II.

Figure 4:
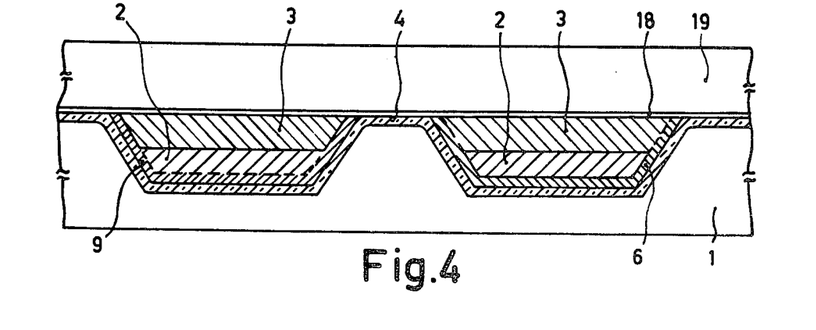

A layer of polycrystalline silicon, approximately 250 microns thick, is then deposited again from the gaseous phase on the oxide layer 5, and forms the final supporting layer 1, see FIG. 4.

The polycrystalline silicon layer 19 is then removed, for example, by etching with a $HF-HNO_3$-solution, after which the silicon nitride layer 18 is removed by etching with phosphoric acid at approximately 180° C. A layer of silicon oxide is then deposited again on the thus exposed surface 4, in which layer windows are first etched photolithographically for indiffusing the connection zone 7, for example, by means of a boron diffusion. A diffusion window is then etched in the oxide layer for indiffusing the less deep p-type emitter zone 11 of the complementary second transistor structure and for indiffusing a p-type zone 21 (see FIG. 5). The zones 11 and 21 may be indiffused simultaneously, the zone 21 serving to facilitate the contacting of the collector contact layer 9 without running the risk of shortcircuiting the p-n junction between the layer 9 and the layer 3 at the surface; see also FIG. 1.

Figure 5:
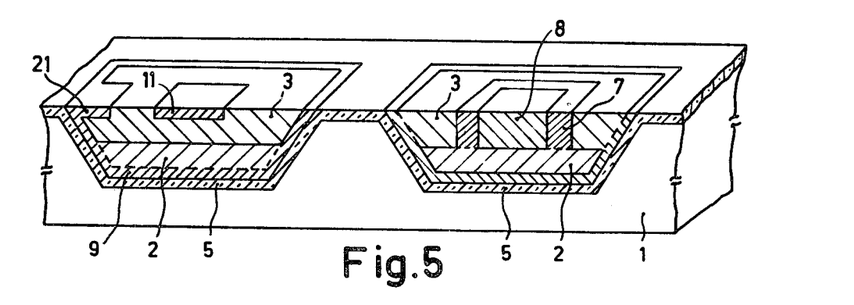

By a selective diffusion of a donor, for example phosphorus, in the zone 8 the doping of the emitter zone can be increased to improve the emitter efficiency.

After etching contact windows in a further deposited layer 22 of silicon oxide or of another insulating material, and metallizing, for example, by vapour-deposition of aluminum, the structure shown in FIG. 1 is obtained.

It will be obvious that, in addition to the two islands I and II shown, the device may comprise more islands in which further active and/or passive semiconductor circuit elements are incorporated.

Figure 6:
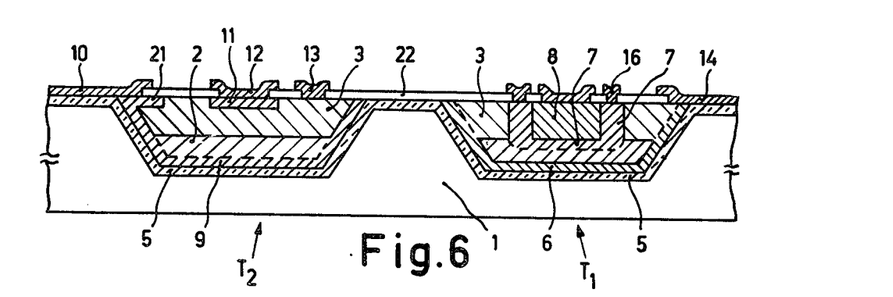
FIG. 6 is a diagrammatic cross-sectional view of a variation of the device shown in FIG. 1.

Although the active part of the base of transistor $T_1$ in the embodiment just described is formed by the epitaxial layer 2 in the form in which it is deposited, said transistor can be made suitable, if desired, for a higher frequency range by a slight variation in the manufacture. For that purpose, for example, the zones 7 and 8 are provided so that first a p-type zone 7 is provided, for example, by a boron diffusion, in the whole region occupied by the zones 7 and 8 and across a part of the thickness of the layer 2, after which the emitter zone 8 is provided by a phosphorus diffusion of higher doping which compensates for the boron diffusion. The cross-section which corresponds to FIG. 1 then looks like that of FIG. 6, the npn transistor $T_1$ of which has a thinner effective base zone and is hence suitable for higher frequencies.

Figure 7:
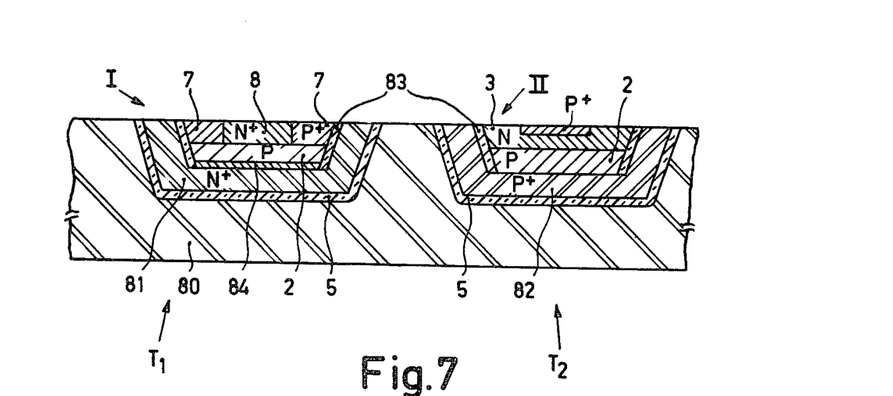
FIG. 7 is a diagrammatic cross-sectional view of a further variation of the device shown in FIG. 1.

Instead of in the form of the structure described, the device according to the invention may be used in various other forms while using dielectric insulation. An example is shown in the diagrammatic cross-sectional view of FIG. 7. In this Example the transistor structures $T_1$ and $T_2$ are also provided in semiconductor islands I and II which are separated from the remaining part of the body 80, for example, of polycrystalline silicon, by an insulating dielectric layer 5 of silicon oxide. The islands I and II, however, consist in this Example partly of highly doped polycrystalline silicon (81, 82), while the remaining part of the islands is constructed from parts of a first, p-type conductive epitaxial layer 2 and a second n-type conductive epitaxial layer 3, which epitaxial parts are separated laterally from the surrounding polycrystalline silicon by a wall 83 of silicon oxide. In this Example the connection zone 7 continues up to the oxide layer 83 and is separated from the n-type region (81, 84) by said layer 83. 84 denotes an n-type zone which has been formed in the epitaxial layer 2 by diffusion from the polycrystalline silicon and forms a p-n junction in said layer 2, so in the monocrystalline region. The way in which a dielectric insulation as described in FIG. 7 can be obtained has been described in "Semiconductor Silicon 1973" (Proceedings of the Second International Symposium on Silicon Material Science and Technology, May 13–18, 1973, Chicago), pp. 893–904, "A New Technology for Dielectric Isolation" by Y. Sumitomo et al.

It is to be noted that, should this be deemed desirable, for example, to obtain a lower collector resistance, a metal layer, for example, a molybdenum layer, which, if desired, extends up to the surface may be provided in all said dielectrically insulated structures between the dielectric layer and the island.

Figure 8:
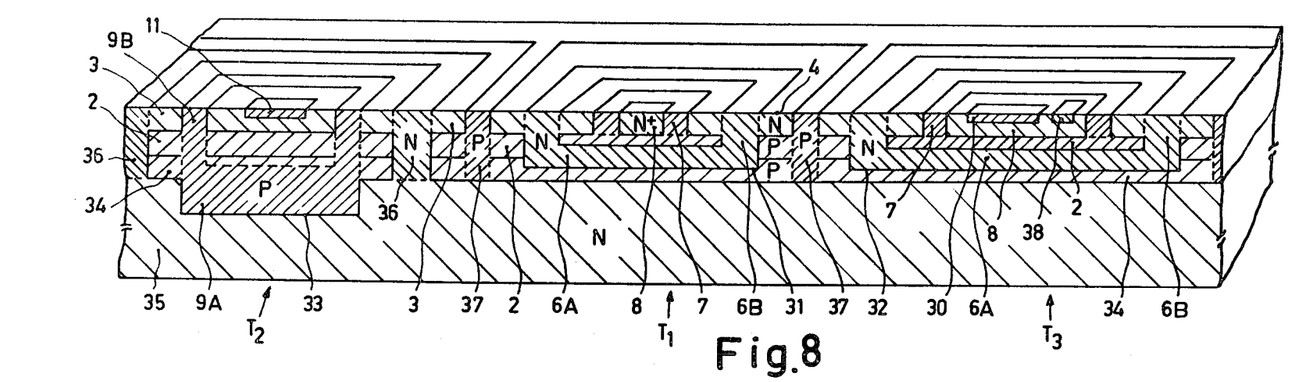
FIG. 8 is a diagrammatic cross-sectional view, partly a perspective view, of another embodiment of a semiconductor device according to the invention.
Figure 9:
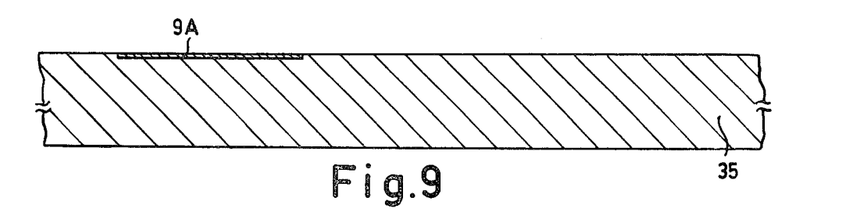
FIGS. 9 to 14 are diagrammatic cross-sectional views of the device shown in FIG. 8 in successive stages of manufacture.
Figure 14:
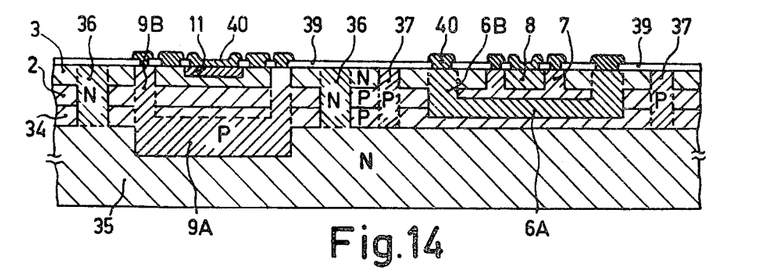

Although the dielectric insulation used in the preceding Example has important advantages, it is also very readily possible to construct the semiconductor device according to the invention by means of the more conventional insulation by means of a reverse biassed p-n junction. An Example of such a device is shown in FIG. 8 partly as a cross-sectional view partly as a perspective view. The corresponding zones of FIGS. 1 to 7 and FIG. 8 are referred to by the same reference numerals. The device shown in FIG. 8 comprises three transistor structures of which an npn-structure ($T_3$) formed by the p-type epitaxial layer 2, the n-type epitaxial layer 3 and the n-type region 6, forms part of a thyristor formed by the regions which determine the transistor structure $T_3$ and by a p-type zone 30 provided in the emitter zone 8 of said transistor structure. The transistor $T_1$ is also of the npn-type, while the pnp-transistor $T_2$ has a structure which is complementary to the two transistor structures $T_1$ and $T_2$. The most important difference with the Example shown in FIGS. 1 through 7 is that the various transistor structures in this case are electrically separated from each other not by dielectric layers but by p-n junctions (31, 32, 33) which in the operating condition are connected in the reverse direction. The semiconductor device shown in FIG. 8 furthermore comprises a third p-type conductive epitaxial layer 34 which is grown on an n-type substrate 35 and forms a p-n junction therewith and on which the epitaxial layers 2 and 3 are provided. For clarity, the metallization on the upper face is not shown in FIG. 8, nor is the insulated layer which is present on the upper face and in which the contact windows are provided. In so far as the contacting of the transistor structures $T_1$ and $T_2$ is concerned, this is shown in FIG. 14; the zone 8 of the thyristor (6, 2, 8, 30) to which the transistor structure $T_3$ belongs is contacted at the surface via a more highly doped contact zone 38 to form an ohmic control electrode.

The manufacture of the semiconductor device shown in FIG. 8 may be carried out, for example, according to a method of which successive stages are shown in the cross-sectional views of FIGS. 9 through 14. Starting material (see FIG. 9) is an n-type silicon substrate 35, approximately 250 microns thick, resistivity approximately 5 Ohm.cm. A highly doped p conductive layer 9A is obtained locally, for example, by diffusion of boron, while using conventional masking and etching methods. An approximately 15 microns thick p-type silicon layer 34, resistivity approximately 10 ohm.cm, is then grown epitaxially by using known methods, preferably from the gaseous phase. During the said epitaxial growth, the layer 9A diffuses partly into the substrate 35 and partly into the layer 34.

Figure 10:
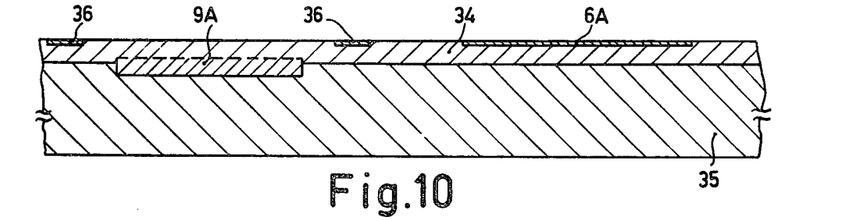

The layer 34 is then subjected locally to an arsenic diffusion to form an n-type layer 6A and to a phosphorus diffusion to form the n-type isolation zone 36 which surrounds the layer 9A, see FIG. 10.

Figure 11:
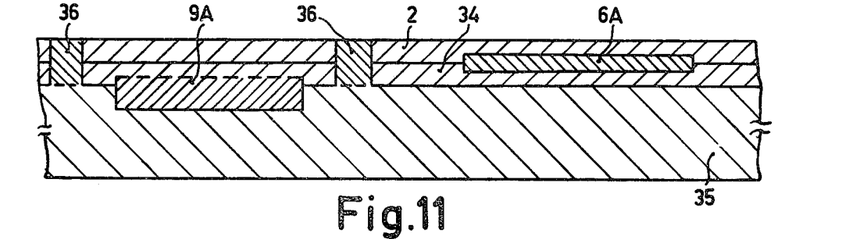

An approximately 15 microns thick p-type silicon layer 2, resistivity approximately 5 Ohm.cm, is then grown epitaxially. During said growth the zone 36 diffuses into the layers 34 and 2 and the layer 9A also diffuses further into the layer 34 and into the substrate 35. The layer 6A diffuses slightly into the layers 2 and 34, but since the diffusion rate of arsenic is considerably lower than that of boron and phosphorus, the expansion of the layer 6A is only small, see FIG. 11.

Figure 12:
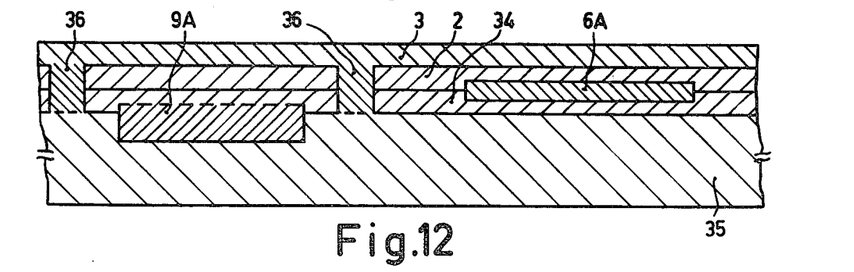
Figure 13:
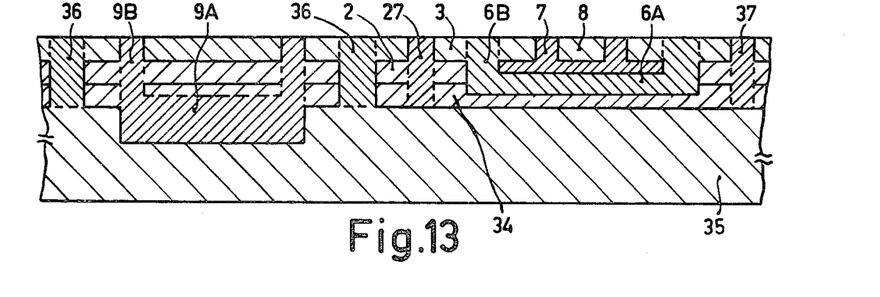

An n-type silicon layer 3, thickness approximately 10 microns, resistivity approximately 30 Ohm.cm, is then grown epitaxially on the layer 2 (see FIG. 12). In this epitaxial growth also, the already diffused zones expand to a greater or lesser extent. Boron is then indiffused locally in the surface of the layer 3 while using the conventional masking and diffusion methods so as to form the p-type zones 7 and 9B and of the isolation zone 37, after which the zone 6B is formed, for example, by a phosphorus diffusion, see FIG. 13. The emitter zone 11 is then formed by a comparatively light boron diffusion after which, for example, by a light phosphorus diffusion, the zone 8 is more highly doped than the surrounding part of the layer 3, see FIG. 14. This same phosphorus diffusion may be used to provide the n-type contact zone 38 of the thyristor structure comprising the transistor structure $T_3$, see FIG. 8.

Although said thyristor structure is not shown in FIGS. 9 through 14 to avoid complexity of the drawings, it will be obvious that the zones denoted therein by the same reference numerals can be formed simultaneously with the corresponding zones of the structures $T_1$ and $T_2$, while the zone 30 may be provided simultaneously with the zone 11. The surface is finally provided with an insulating layer 39, preferably of silicon oxide, in which contact windows are etched after which the metallization in the form of, for example, aluminum layers 40 is provided as is shown diagrammatically in FIG. 14.

Figure 15:
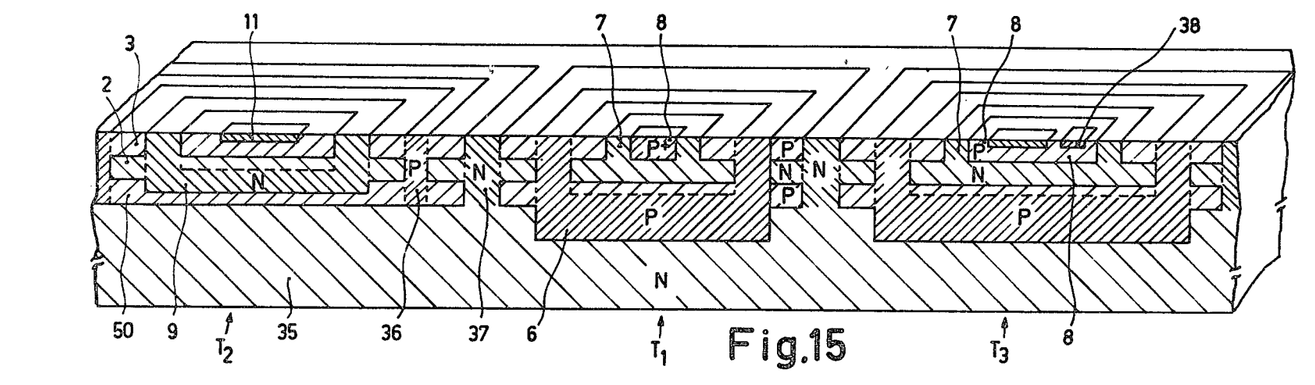
FIGS. 15, 16 and 17 are diagrammatic cross-sectional views, partly perspective views, of further embodiments of a semiconductor device according to the invention.

Another manner of forming a device according to the invention with complementary transistor structures $T_1$ and $T_2$ and $T_3$ and $T_2$, respectively, is shown in FIG. 15 in which the parts corresponding to the Example of FIG. 8 are referred to by the same reference numerals. In this case a third p-type epitaxial layer 50 is provided between the n-type substrate 35 and the first, in this case n-type, epitaxial layer 2. The transistor structure $T_3$ in this case also forms part of a pnpn thyristor. The Figure needs no further explanation and the device can be manufactured in a manner analogous to that of FIG. 8.

In the preceding Examples according to FIGS. 8 and 15 an n-type substrate was used. It is to be noted that in these Examples the conductivity type of all the semiconductor regions may be inverted, if desired. However, in connection with the properties of the available donors and acceptors, such a structure would be difficult to realize since in practice it is not readily possible in silicon to find a useful acceptor and donor in which, at the same temperature, the acceptor has a lower diffusion rate than the donor. Nevertheless, in practice a p-type substrate is usually preferred since in that case one can connect the substrate to ground potential so as to ensure a good insulation.

Figure 16:
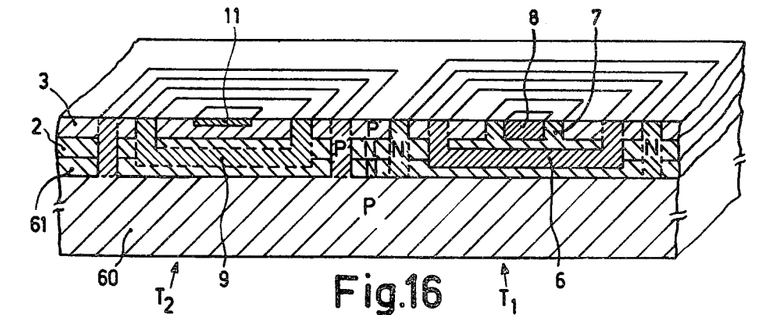
Figure 17:
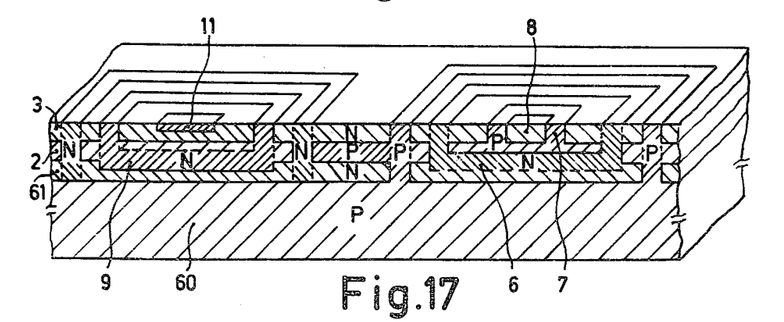

FIGS. 16 and 17 show two Examples in which a p-type substrate 60 and a third n-type epitaxial layer 61 which forms a p-n junction with the substrate 60 are used. It will be obvious that in realizing the given structures those skilled in the art will take the necessary measures to prevent that the various buried layers, in particular the boron-doped layers, diffuse to such an extent in the direction of thickness during the epitaxial growth that undesired effects, for example, too high collector and base resistances, too low base thicknesses or shortcircuits, are obtained. It is furthermore to be noted that the isolation zones 36 and 37 in FIGS. 9 through 14, in particular as regards their extent in a direction transverse to the surface, are shown purely diagrammatically for clarity and are not in agreement with reality in each manufacturing stage. The ultimate thickness of said zones as shown in FIG. 8 is the result of all the thermal treatments carried out during the manufacture and the diffusion caused thereby.

Figure 18:
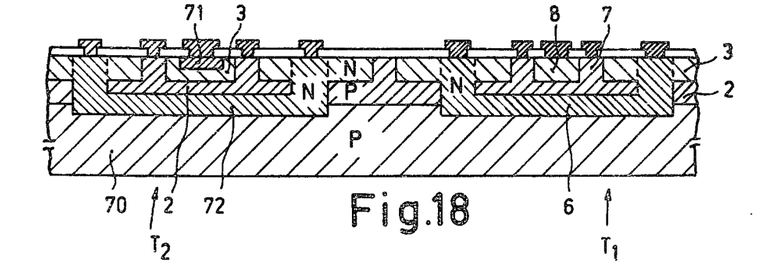
FIG. 18 is a diagrammatic cross-sectional view of still another embodiment of a semiconductor device according to the invention.

FIG. 18 finally is a diagrammatic cross-sectional view of another embodiment of a device according to the invention having two substantially anaogously built-up structures in which, while using only two epitaxial layers, for example a p-type layer 2 and an n-type layer 3 on a p-type substrate 70, and two n-type conductive regions 6 and 72, a first npn transistor structure $T_1$ (8, 2, 6) and a second pnp transistor structure $T_2$ which is complementary thereto and is formed by the layers 2 and 3 and the p-type zone 71 are realized. The transistor structure $T_2$ together with the n-type region 72 forms part of a pnpn thyristor (71, 3, 2, 72) which is contacted as is shown in FIG. 18.

It will be obvious that the invention is not restricted to the embodiments described but that many variations are possible to those skilled in the art without departing from the scope of this invention. In particular, without deviating from the idea underlying the invention, semiconductor materials other than silicon, for example germanium, III-V compounds such as GaAs and so on, and insulating layers other than silicon oxide, for example, aluminum oxide or silicon nitride may be used. Instead of by thermal decomposition of a semiconductor compound, the epitaxial layer may also be provided, for example, by direct vapour deposition of the semiconductor material or by epitaxial growth from the liquid phase. Instead of by diffusion, the doping of some zones may also be carried out by ion implantation, while the diffusion may also be carried out from, for example, a doped oxide layer. Instead of the said doping materials, if desired, other donor and acceptor materials may also be used. Nor need the device comprise one single seiconductor material, it may also comprise regions of different semiconductor materials forming heterojuctions with each other. In addition, the supporting layers 1, 19 and 80 of FIGS. 1 through 7 need not be polycrystalline silicon; in principle, said layers may consist of any desired insulating or non-insulating material. The devices can be manufactured in many different manners while using known doping methods. Those skilled in the art will make an efficacious choice from the possibilities existing for each individual case. In particular, the isolation zones which separate parts of epitaxial layers from each other, for example, the zones 36 and 37 of FIGS. 8 and 15, need not be provided over the whole thickness of all the epitaxial layers. Instead, they may be provided only over the total thickness of those layers having a conductivity type opposite to that of the relevant zone.

What is claimed is:

1. A semiconductor device comprising at least first and second vertical bipolar transistors which are complementary and electrically isolated from each other, said device comprising a semiconductor body having a substantially flat surface and including a first epitaxially grown layer of substantially uniform thickness of a first type conductivity and a second epitaxially grown layer of substantially uniform thickness adjoining and closer to the surface than and above the first epitaxial layer and of a second type conductivity opposite to that of the first type, said first epitaxial layer being spaced from the surface by said second epitaxial layer, means including a dielectric barrier layer isolating first and second islands adjoining the substantially flat surface and each island including portions of the same first and second epitaxial layers for housing, respectively, the first and second transistors; said first transistor comprising within the first island a first type base zone formed by at least part of the first epitaxial layer, a surface adjoining second type conductivity semiconductor region more highly doped than said second epitaxial layer which adjoins at least said first epitaxial layer portion and substantially entirely surrounds the first and second epitaxial layer portions and forming the first transistor collector zone, and a first type conductivity base connection zone extending from the surface completely through the second epitaxial layer portion and down to the first epitaxial layer portion and being spaced from the collector zone and being more highly doped than the first epitaxial layer portion and entirely surrounding a part of the second epitaxial layer portion, said last-named surrounded part of the second epitaxial layer portion being more highly doped than the remaining portion of said second epitaxial and forming the first transistor emitter zone; said second transistor comprising within the second island a base zone formed by at least part of the second epitaxial layer portion, a collector zone formed by at least part of the first epitaxial layer portion and a first type conductivity surface-adjoining region more highly doped than said first epitaxial layer which substantially entirely adjoins and surrounds parts of the first and second epitaxial layer portions within the second island and forming a sub-collector of the second transistor.

2. A semiconductor device as claimed in claim 1, wherein the base connection zone of the first transistor is separated from the second type region forming the collector zone by a part of the second epitaxial layer.

3. A semiconductor device as claimed in claim 1, wherein the base connection of the first transistor is separated from the second type conductivity region forming the collector zone by a layer of electrically insulating material.

* * * * *

UNITED STATES PATENT AND TRADEMARK OFFICE
CERTIFICATE OF CORRECTION

PATENT NO. : 4,146,905
DATED : March 27, 1979
INVENTOR(S) : JOHANNES A. APPELS ET AL It is certified that error appears in the above–identified patent and that said Letters Patent are hereby corrected as shown below:

Claim 1, line 34, "second epitaxial and forming" should be

--second epitaxial layer and forming--

Signed and Sealed this

Fourteenth Day of August 1979

[SEAL]

Attest:

LUTRELLE F. PARKER
Attesting Officer
Acting Commissioner of Patents and Trademarks